US011502650B2

(12) United States Patent
Watkins

(10) Patent No.: US 11,502,650 B2
(45) Date of Patent: Nov. 15, 2022

(54) POWER AMPLIFIER AND METHOD OF LINEARIZING A POWER AMPLIFIER

(71) Applicant: Kabushiki Kaisha Toshiba, Minato-ku (JP)

(72) Inventor: Gavin Tomas Watkins, Bristol (GB)

(73) Assignee: Kabushiki Kaisha Toshiba, Minato-ku (JP)

(*) Notice: Subject to any disclaimer, the term of this patent is extended or adjusted under 35 U.S.C. 154(b) by 96 days.

(21) Appl. No.: 16/915,271

(22) Filed: Jun. 29, 2020

(65) Prior Publication Data
US 2021/0408972 A1 Dec. 30, 2021

(51) Int. Cl.
H03F 1/32 (2006.01)
H03F 3/24 (2006.01)
H04B 7/185 (2006.01)
H03F 1/02 (2006.01)

(52) U.S. Cl.
CPC ......... H03F 1/3241 (2013.01); H03F 1/0288 (2013.01); H03F 3/245 (2013.01); H04B 7/18515 (2013.01); H03F 2200/451 (2013.01); H03F 2201/3215 (2013.01)

(58) Field of Classification Search
CPC ...... H03F 1/3241; H03F 1/0288; H03F 3/245; H03F 2200/451; H03F 2201/3215; H04B 7/18515
USPC .......................................................... 330/295
See application file for complete search history.

(56) References Cited

U.S. PATENT DOCUMENTS

2009/0088095 A1* 4/2009 Kayano ................ H04B 1/0483
330/126
2012/0262234 A1* 10/2012 Lee ......................... H03F 3/602
330/149

FOREIGN PATENT DOCUMENTS

GB 2 382 936 A 6/2003
WO WO2006/110360 A2 10/2006

OTHER PUBLICATIONS

MAAP-011327 data sheet of MACOM, Rev. V1, © 2020 MACOM All Rights Reserved (Year: 2020).*
Singh, A., "Experimental Investigation of TWT Nonlinearities and Distortion Suppression By Signal Injection", MSc thesis, Electrical and Computer Engineering, University of Wisconsin—Madison 2003 (Year: 2003).*

(Continued)

Primary Examiner — Hafizur Rahman
(74) Attorney, Agent, or Firm — Oblon, McClelland, Maier & Neustadt, L.L.P.

(57) ABSTRACT

A power amplifier comprising:
a first amplifier;
a second amplifier, wherein the first and second amplifiers are arranged in parallel;
an analogue pre-distortion network;
a first coupler; and
a second coupler,
wherein the first coupler is configured to receive an input signal, direct said input signal to the first amplifier, and direct a first pre-distortion signal to the analogue pre-distortion network, wherein
the first pre-distortion signal comprises a first distortion component generated at the input of the first amplifier, and
the analogue pre-distortion network is configured to receive the first pre-distortion signal and manipulate its amplitude and/or phase to obtain a manipulated first pre-distortion signal, and
the second coupler is configured to direct the manipulated first pre-distortion signal to the second amplifier.

20 Claims, 10 Drawing Sheets

(56) References Cited

OTHER PUBLICATIONS

Qi Cai, et al., "A Linear GaN Power Amplifier Using Novel Transistor Based Analog Predistortion Method", 2016 IEEE MTT-S International Microwave Workshop Series on Advanced Materials and Processes for RF and THz Applications, 2016, 4 pages.

G. T. Watkins, et al., "Flexible Linearity Profile Amplifier For Software Defined Radio Applications", The 57th IEEE Semiannual Vehicular Technology Conference, 2003, 6 pages.

R. Neil Braithwaite, et al., "High Efficiency Feedforward Power Amplifier Using a Nonlinear Error Amplifier And Offset Alignment Control", IEEE MTT-S International Microwave Symposium Digest (MTT), 2013, 4 pages.

Khaled Fayed, et al., "A Mirror Predistortion Linear Power Amplifier", WAMICON 2011 Conference Proceedings, 2011, 6 pages.

S.C. Bera, et al., "Diode-based predistortion lineariser for power amplifiers", Electronics Letters, vol. 44, No. 2, 2008, 3 pages.

Tayfun Nesimoglu, "Broadband analogue predistortion using a distortion generator based on two-stage RF mixer topology", International Journal of Electronics, 2018, 17 pages.

Sung Yong Kim, et al., "Linearity Improvement and Efficiency Boosting for Parallel Power Amplifiers", Asia-Pacific Microwave Conference Proceedings, 2005, 4 pages.

Paul Rako, "RF Predistortion Straightens out Your Signals", https://www.edn.com/rf-predistortion-straightens-out-your-signals/, 2011, 13 pages.

Allen Katz, et al., "Satellite Linearizers for Q, V and W-band", IEEE Benjamin Franklin Symposium on Microwave and Antenna Subsystems for Radar, Telecommunications, and Biomedical Applications, 2014, 3 pages.

P. A. Warr, et al., "Amplifier linearisation by exploitation of backwards-traveling signals", Electronics Letters, vol. 38, No. 6, 2002, 2 pages.

\* cited by examiner

POWER AMPLIFIER AND METHOD OF LINEARIZING A POWER AMPLIFIER

FIELD

Embodiments described herein relate generally to power amplifiers and methods of linearizing said power amplifiers.

BACKGROUND

RF power amplifiers (PA) are used to amplify modulated RF signals in applications such as ground stations for TV broadcasting. The signal bandwidth is typically 500 MHz at either Ku-band (14-15 GHz) or Ka-band 28 GHz). To ensure efficient operation of the PA, the PA are operated in their compression region. The compression region of the PA is a region of operation where there is a non-linear increase in output power for an input power. The non-linearity of the PA generates distortion products, which corrupt the signal. The distortion products appear as additional components on the RF output spectrum and may fall in the operation frequencies allocated to adjacent channels. The distortion products may breach the emission mask.

Further, at frequencies of 10 GHz or more, it is difficult to produce single amplifier devices capable of producing high output powers (Pout). Several smaller amplifiers may be combined in parallel instead. Such amplifiers are often referred to as power combining amplifiers.

There is a continuing need to improve RF power amplifiers (PA) for producing high output powers with reduced signal distortion.

Arrangements of the embodiments will be understood and appreciated more fully from the following detailed description, made by way of example only and taken in conjunction with drawings in which.

DETAILED DESCRIPTION

Figure 1:
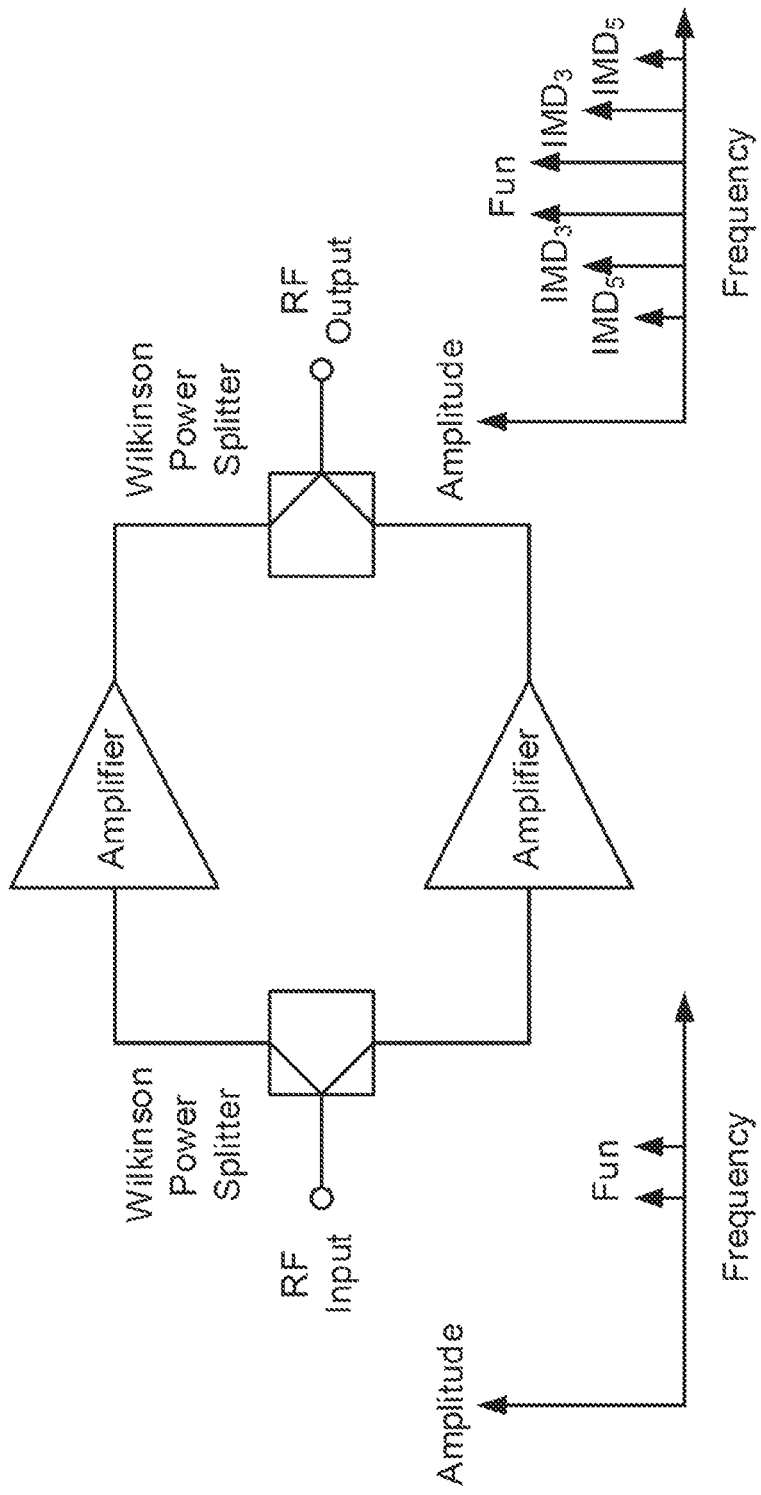
FIG. 1 shows a schematic illustration of RF power amplifier (PA) with two amplifiers arranged in parallel according to prior art.

A power amplifier comprising:
a first amplifier;
a second amplifier, wherein the first and second amplifiers are arranged in parallel;
an analogue pre-distortion network;
a first coupler; and
a second coupler,
wherein the first coupler is configured to receive an input signal, direct said input signal to the first amplifier, and direct a first pre-distortion signal to the analogue pre-distortion network, wherein
the first pre-distortion signal comprises a first distortion component generated at the input of the first amplifier, and
the analogue pre-distortion network is configured to receive the first pre-distortion signal and manipulate its amplitude and/or phase to obtain a manipulated first pre-distortion signal, and
the second coupler is configured to direct the manipulated first pre-distortion signal to the second amplifier.

In an embodiment, the first pre-distortion signal further comprises a portion of the input signal.

In an embodiment, the analogue pre-distortion network comprises an attenuator and/or a phase shifter.

In an embodiment, the attenuator and/or phase shifter are variable.

In an embodiment, the attenuator and/or the phase shifter are configured so that the manipulated pre-distortion signal received at the second amplifier causes a distortion generated at the output of the second amplifier to be suppressed.

In an embodiment, the second coupler is further configured to direct a second pre-distortion signal to the analogue pre-distortion network,
wherein the second pre-distortion signal comprises a second distortion component generated at the input of the second amplifier, and
wherein the analogue pre-distortion network is further configured to receive the second pre-distortion signal and manipulate its gain and/or phase to obtain a manipulated second pre-distortion signal; and
the first coupler is further configured to direct the manipulated second pre-distortion signal to the first amplifier.

In an embodiment, the first coupler and the second couplers are Wilkinson power splitters.

In a further embodiment, the first amplifier and the second amplifier are operable in-phase.

In an embodiment, outputs of the first and second amplifiers are combined in a Wilkinson power splitter to provide an output signal.

In an embodiment, outputs of the first and second amplifiers are combined in a transformer or balun to provide an output signal.

In a further embodiment, the first amplifier and the second amplifier are operable in anti-phase.

In an embodiment, the first amplifier and the second amplifier are operable in their gain compression region.

In an embodiment, the first amplifier and the second amplifier are similar. The first and second amplifier produce a first distortion component and a second distortion component that are similar to each other.

In an embodiment, the analogue pre-distortion network further comprises a third amplifier that amplifies the first pre-distortion signal.

According to a second aspect, there is provided a relay system for Ku and Ka bands comprising the amplifier according to the first aspect.

According to a third aspect, there is provided a method for linearizing a power amplifier that comprises a first amplifier and a second amplifier arranged in parallel, and an analogue pre-distortion network, the method comprising:

receiving an input signal;

directing the input signal to the first amplifier and the second amplifier;

directing a first pre-distortion signal from the first amplifier to the analogue pre-distortion network to manipulate the amplitude and/or phase of the first pre-distortion signal; and directing the manipulated first pre-distortion signal to the second amplifier, wherein the first pre-distortion signal comprises a first distortion component generated at the input of the first amplifier.

According to a fourth aspect, there is provided two or more power amplifiers according to the first aspect, wherein the power amplifiers are connected in parallel.

Distortion products may arise from the operation of an RF PA. In particular, distortion products may arise when the RF PA is operating in its compression region. The distortion products can be reduced with a pre-distorter, which distorts an incoming signal in a particular fashion so that its distortion cancels with that generated by the RF PA. In conventional designs, the pre-distorter is implemented digitally in baseband where complex functions can be implemented.

Digital pre-distortion (DPD) is only suitable for signals with moderate bandwidth since the digital baseband must operate at 5× the RF signal bandwidth. For outdoors TV broadcasting, the signal bandwidth is 500 MHz and is transmitted at either Ku-band (14-15 GHz) or Ka-band (28 GHz). DPD may not be suitable for such signals. Analogue pre-distorters (APD) are used instead; however, conventional APDs are complex and costly. As described herein, there is provided a low complexity APD for parallel amplifier architectures. The APD may be incorporated into the parallel amplifier architecture.

Embodiments described herein provide a low complexity APD that exploits the distortion generated from an amplifier's input port. Embodiments herein are configured for parallel amplifier architectures comprising at least two amplifiers wherein the distortion product at the input of one amplifier is used to pre-distort another amplifier and vice-versa. The use of a parallel architecture with at least two amplifiers enables the required output power ($P_{OUT}$) to be achieved.

FIG. 1 shows a schematic illustration of an RF power amplifier (PA) according to an example. The PA comprises two amplifiers arranged in a parallel configuration. The RF input signal is split into two using a first Wilkinson Power Splitter (PS) and directed to the inputs of the each amplifier. The signals generated at the output of each amplifier are directed to second Wilkinson Power Splitter (PS) where they are combined to provide an RF output. To ensure efficient operation, the PA is operated into its compression region.

The parallel arrangement of the amplifiers means that both amplifiers "see" the RF input signal and both amplifiers contribute to the RF output signal.

FIG. 1 also shows the spectrum of an RF input and the spectrum of the corresponding RF output when the PA is operated as above. The RF input is a two-tone test signal that comprises two fundamental tones (Fun) at two distinct frequencies. Such two-tone test signals are used to characterise distortion in a non-linear component. The fundamental tones interact in the non-linear component to create additional frequency tones at the sums and/or differences of integer multiples of the original frequencies. Those additional frequency tones are the distortion products and appear in the RF output spectrum. The most common distortion products are the third order intermodulation distortion ($IMD_3$) and fifth order intermodulation distortion ($IMD_5$). The $IMD_3$ and $IMD_5$ may fall into adjacent channels and can interfere with other services using those channels. They are equivalent to the Adjacent Channel Power (ACP) produced by wideband-modulated signals, i.e. LTE or DVB. Distortion products are also referred to as distortion components.

FIG. 1 further shows the spectrum of the RF output signal obtained when the PA is operated as above. The output spectrum comprises amplified versions of the fundamental tones (Fun) and distortion products $IMD_3$ and $IMD_5$. It is desirable to suppress the $IMD_3$ and $IMD_5$ products and amplify the fundamental tones.

The parallel amplifier structure of FIG. 1 is usable in Ku and Ka band mobile TV broadcast or relay systems.

A Wilkinson power splitter (PS) is a three-port device comprising an input port and two output ports. The PS is configured to split a signal fed into an input port into two equal output signals at the output ports; or, conversely, to combine two signals entering the output ports into a single signal at the input port. When the device is used in the latter configuration, it is also referred to as a power combiner. When a signal is fed into an output port, the signal appears at the input port, but not at the other output port.

Alternatively, instead of the Wilkinson power splitter, it will be understood that, in general, a coupler may be used instead. The coupler is configured to direct a signal fed into a first port to a second port and a third port; the signal may be divided equally or unequally between the second and third ports. The coupler is also configured to direct a signal fed into the second port to the first port. The coupler is also configured to direct a signal fed into the third port to the first port.

Alternatively, instead of the Wilkinson power splitter being used as a combiner, other in-phase combiners could also be used. An example is rat-race couplers. The in-phase combiners enable the two amplifiers to operate in-phase.

Figure 2:
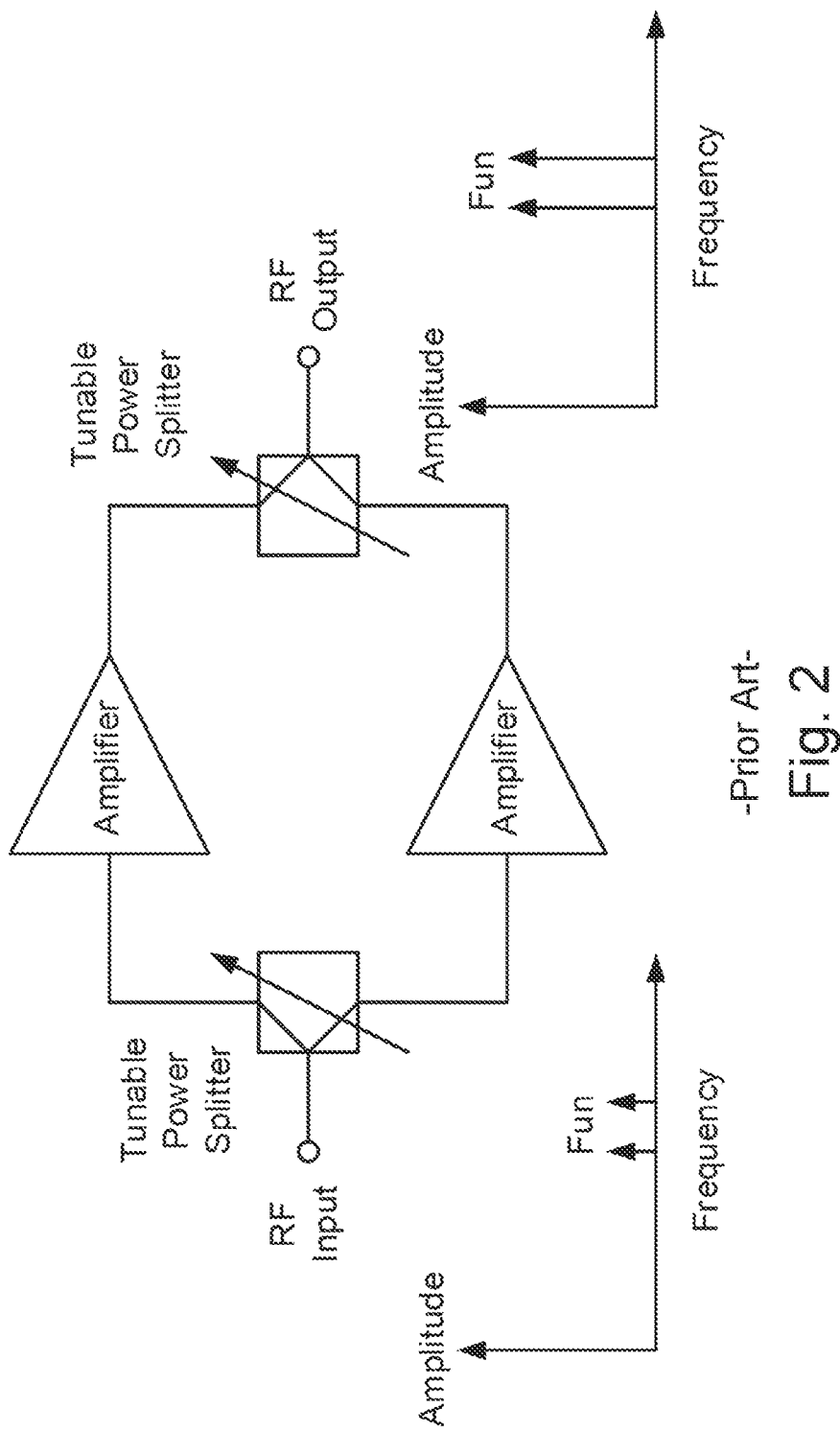
FIG. 2 shows a schematic illustration of RF power amplifier (PA) with two amplifiers arranged in parallel according to prior art.

FIG. 2 shows a schematic illustration of a parallel two-amplifier RF power amplifier (PA) according to another example. The PA is similar to that of FIG. 1 except that the Wilkinson power splitters (PS) are replaced by a tuneable power splitter and combiner. By tuning the splitter coupled to the inputs of the amplifiers and the combiner coupled to the outputs of the amplifiers, the distortion products and the ACP may be suppressed.

The tuneable power splitter is similar to the Wilkinson power splitter except that the input may be split into unequal output signals. For example, rather than a 50:50 split, the splitter may be split into uneven ratios such as 30:70, or 90:10, or any other appropriate ratio. The ratio may be varied by, for example, varying an impedance coupled to a port of the power splitter. Similarly, by tuneable power combiner, it is meant that the two signals entering the combiner may contribute to the combined signal by different amounts.

Figure 3:
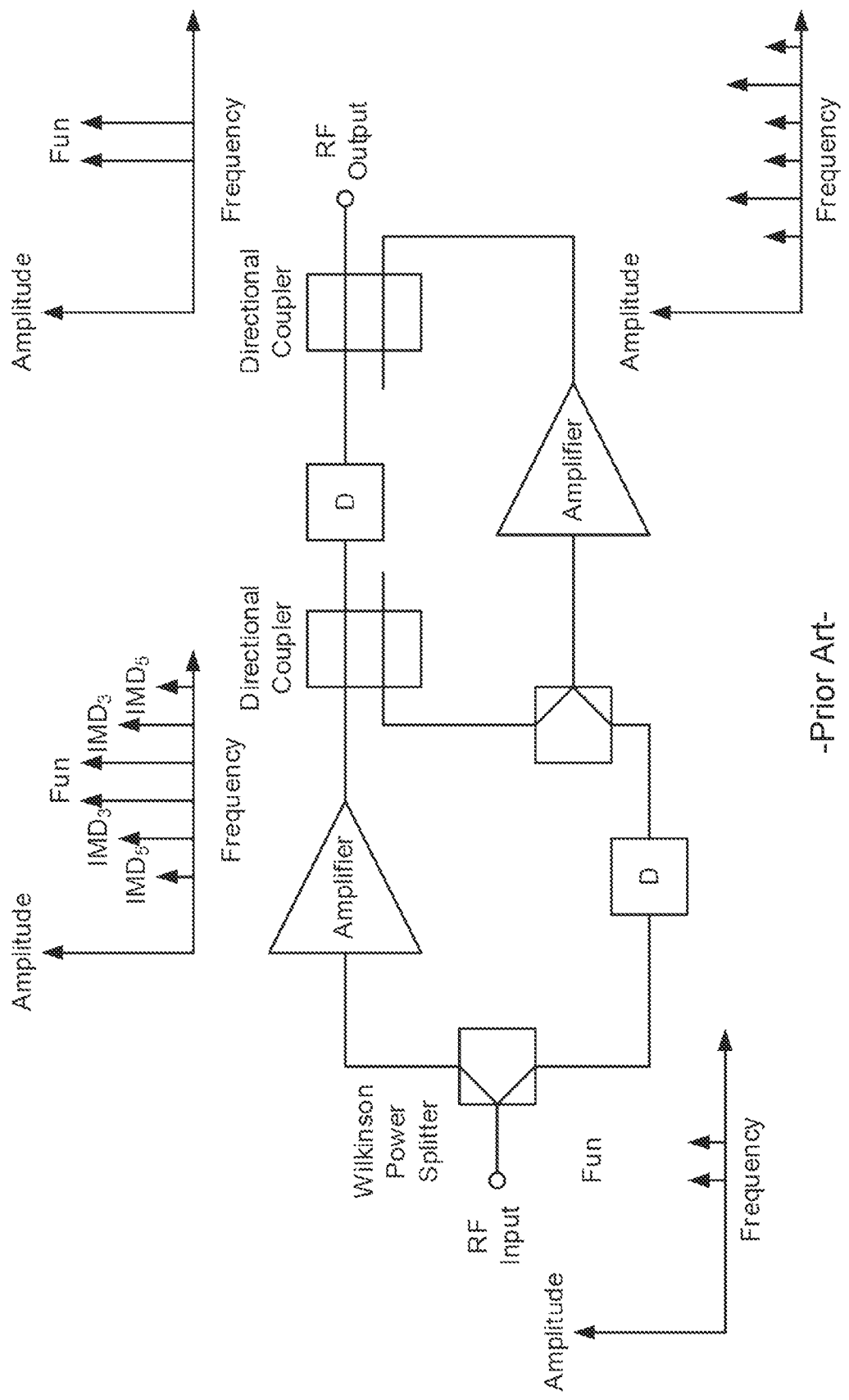
FIG. 3 shows a schematic illustration of feedforward RF power amplifier (PA) according to prior art.

FIG. 3 shows a schematic illustration of a feedforward RF power amplifier according to an example. The feed forward PA comprises a PS that splits the RF input into two portions and directs one portion to the input of a first amplifier (the top amplifier of FIG. 3), and the other portion to a first delay element (lower element "D" in FIG. 3). The output of the first amplifier is coupled to a first directional coupler, which transmits a fraction of the signal from the first amplifier to transmission port, and a fraction of said output to a coupled port. The signal from the transmission port of the first directional coupler is directed to a second delay element (upper element "D" in FIG. 3) configured to delay the signal, which is itself further connected to a second directional coupler.

The output of the first delay element, which is a delayed version of the RF input, and the signal at the coupled port of the first coupler are directed to a power combiner. The signal at the coupled port of the first coupler comprises the desired input 'Fun' as well as the IMD components. At the power combiner, the two signals are combined, such that the delayed RF input is subtracted from signal from the first coupler, to obtain an error signal. It will be understood that in order to subtract the delayed RF input from the signal from the first coupler, the two signals must be in anti-phase. In particular, the delayed Fun component and the Fun component from the output of the first amplifier must be in antiphase for them to subtract. The antiphase could be achieved by delaying one of the signals. Alternatively, the first amplifier may have an antiphase response. Yet alternatively, one of input splitter PS or the combiner may be replaced by an antiphase type.

At the output of the power combiner, the 'Fun' components are suppressed from the error signal. It is desirable to suppress the 'Fun' components completely so that they are completely removed from the error signal. This is to suppress the fundamental tones so that the signal appearing at the input of the lower amplifier is composed of only distortion ($IMD_3$ and $IMD_5$).

In practice however, the error signal comprises a portion of the desired signal (the two fundamental tones "Fun") together with the distortion product. The error signal isolates any distortion product that may be produced by the first amplifier. The error signal is directed to a second amplifier where it is amplified. The amplified error signal at the output of the second amplifier may comprise a portion of the 'Fun' components, as shown in the inset of FIG. 3. The ratio of 'fun' components to the distortion components is less than the signal at the output of the upper amplifier. When these two signals are combined in the output directional coupler, the distortion product will be completely suppressed. The 'fun' components will be suppressed as well but by lesser amount compared to the suppression of the distortion products.

The second directional coupler is connected to the output of the second amplifier. In the second directional coupler, the amplified error signal (which comprises the distortion product of the first amplifier), and the delayed output from the first amplifier are combined. The directional coupler is configured so that the amplified distortion product is subtracted from the delayed output of the first amplifier to produce a distortion free RF output at an output port of the second directional coupler.

Operationally, the arrangement of FIG. 3 isolates the distortion product introduced by a non-linear amplifier (the first amplifier) by comparing the output of said amplifier with the RF input. The distortion product is then subtracted from the output of the first amplifier, and a distortion-free RF output is obtained. The PS, delay elements, directional couplers, and the second amplifiers are configured to enable the comparison and subtraction.

Figure 4:
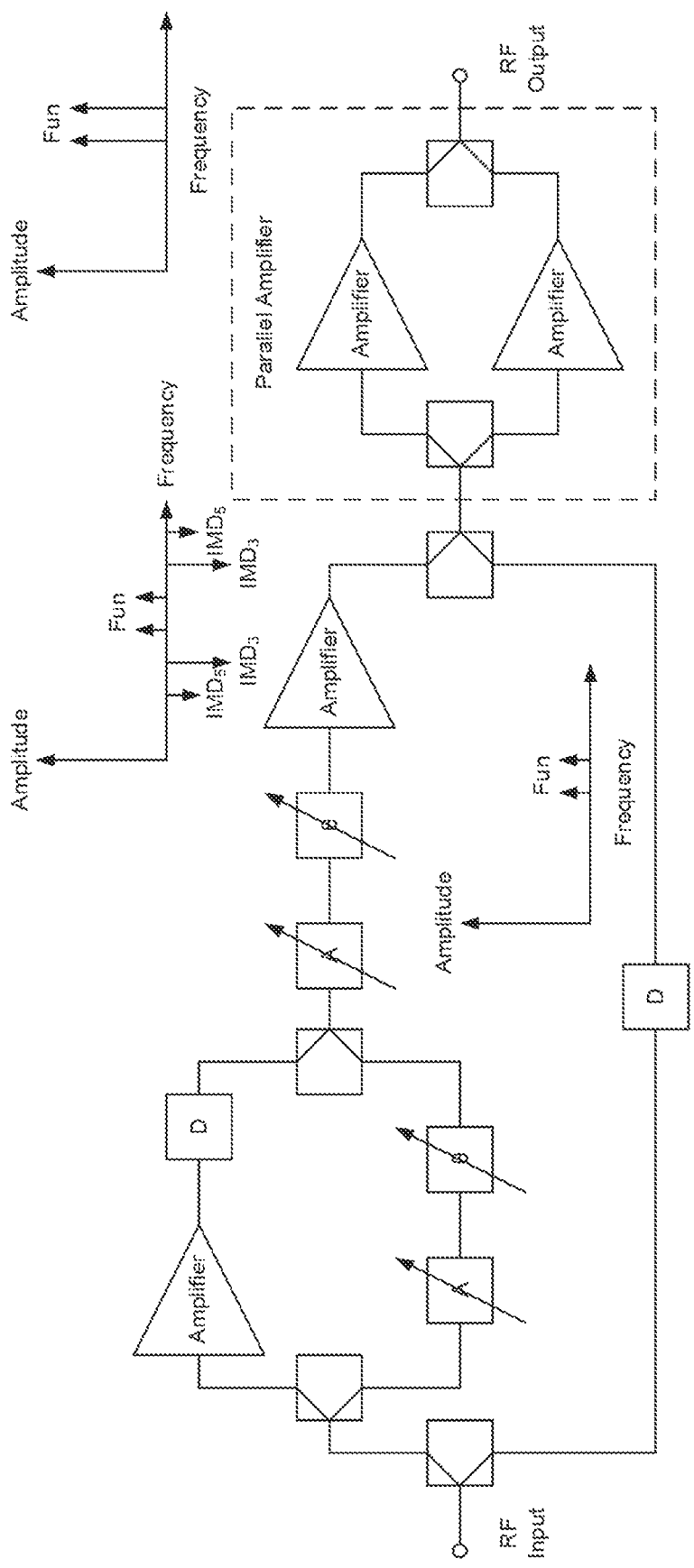
FIG. 4 shows a schematic illustration of RF power amplifier (PA) with two amplifiers arranged in parallel preceded by an analogue pre-distortion block according to prior art.

FIG. 4 shows a schematic illustration of an amplifier comprising an analogue pre-distortion (APD) block. The amplifier comprises a parallel amplifier PA, which is shown in the dashed box, and the parallel amplifier PA is the same as that described in relation to FIG. 1. The APD block precedes the PA and is configured to produce a distortion which is the opposite of that generated by the PA. The APD block is configured to receive an RF input and direct the signal produced to the PA. In this arrangement, the distortion produced by the PA is minimised due to the opposite distortion produced by the APD block.

The amplifier shown in FIG. 4 is also referred to as a "mirror" analogue pre-distortion because the amplifiers used in the parallel power amplifier PA are identical to that used in the pre-distorter APD block. Being identical, they will have the same distortion profile so that the distortion produced by the pre-distorter will cancel with that generated by the parallel amplifier PA, to produce a distortion free RF Output.

The APD block of FIG. 4 comprises an input PS that splits the RF input and directs it along two paths.

In the lower path, the signal is delayed by a delay element D. The signal from the lower path corresponds to the RF input signal, which in this example, comprises a two-tone signal (Fun) as shown in FIG. 4.

In the upper path, the signal is further divided and passed in along two paths. In the first path, the signal is amplified and delayed. Distortion products are generated at this amplification stage. In the second path, the signal is gain and phase manipulated using a variable attenuator A and a variable phase shifter θ. The signals from the first and second paths are combined, further gain and phase manipulated, and further amplified. The further amplified signal comprises the fundamental tones as well as distortion products. The polarity of the distortion product is configured to have the opposite polarity to that of the subsequent PA. This is achieved by adjusting the gain and phase modulators.

The signals from the upper and lower paths are combined in a PS and directed to the PA. The combined signal output by the APD block comprises a pre-distortion signal that is configured to cancel the distortion product of the PA.

The example of FIG. 4 comprises four control elements, namely, two variable attenuators and two variable phase shifters. The variable attenuators are devices configured to attenuate a signal that passes through them. The degree of attenuation is adjustable by applying a voltage or current control signal, or by mechanical tuning (e.g. using a thumb wheel). The variable phase shifters are devices configured to add a phase shift to a signal that passes through them. The amount of phase shift is adjustable by applying or voltage or current control signal, or by mechanical tuning (e.g. using a thumb wheel).

Figure 5:
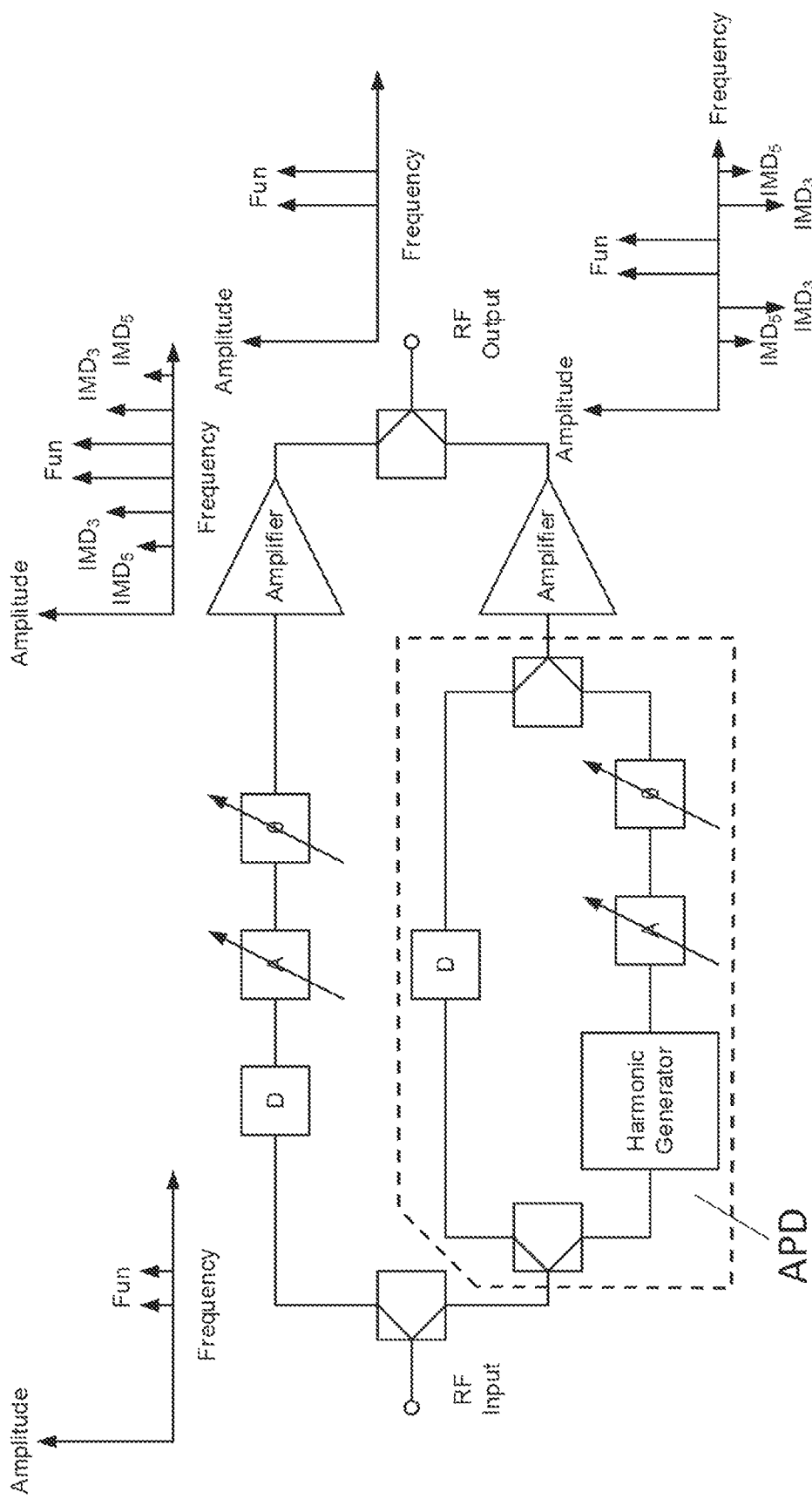
FIG. 5 shows a schematic illustration of RF power amplifier (PA) with two amplifiers arranged in parallel and analogue pre-distortion incorporated into the path of one of the amplifiers according to prior art.

FIG. 5 shows a schematic illustration of a hybrid amplifier comprising a feedforward and APD scheme. The hybrid amplifier comprises the two amplifier parallel configuration described in FIG. 1 except that the APD, shown in the dashed box in FIG. 5, is incorporated into the lower path of a parallel amplifier, and additional delay and A and θ control. The APD is manipulated so that it "over pre-distorts" the second amplifier (the lower amplifier in FIG. 5). The lower amplifier is taken beyond the point where its distortion is suppressed so that it produces distortion which has the opposite polarity to that of the first amplifier (the upper amplifier in FIG. 5).

The outputs of the lower and upper amplifier are combined in a power combiner to form an RF output signal. The wanted signals from each amplifier will add but the distortion products will cancel, since the distortion of the lower amplifier has the opposite polarity. Examples of the spectra of the signals at the outputs of each amplifier are shown in FIG. 5.

The pre-distortion signal generated in the APD in this example is produced with a "harmonic generator", but other arrangements are possible.

Figure 6:
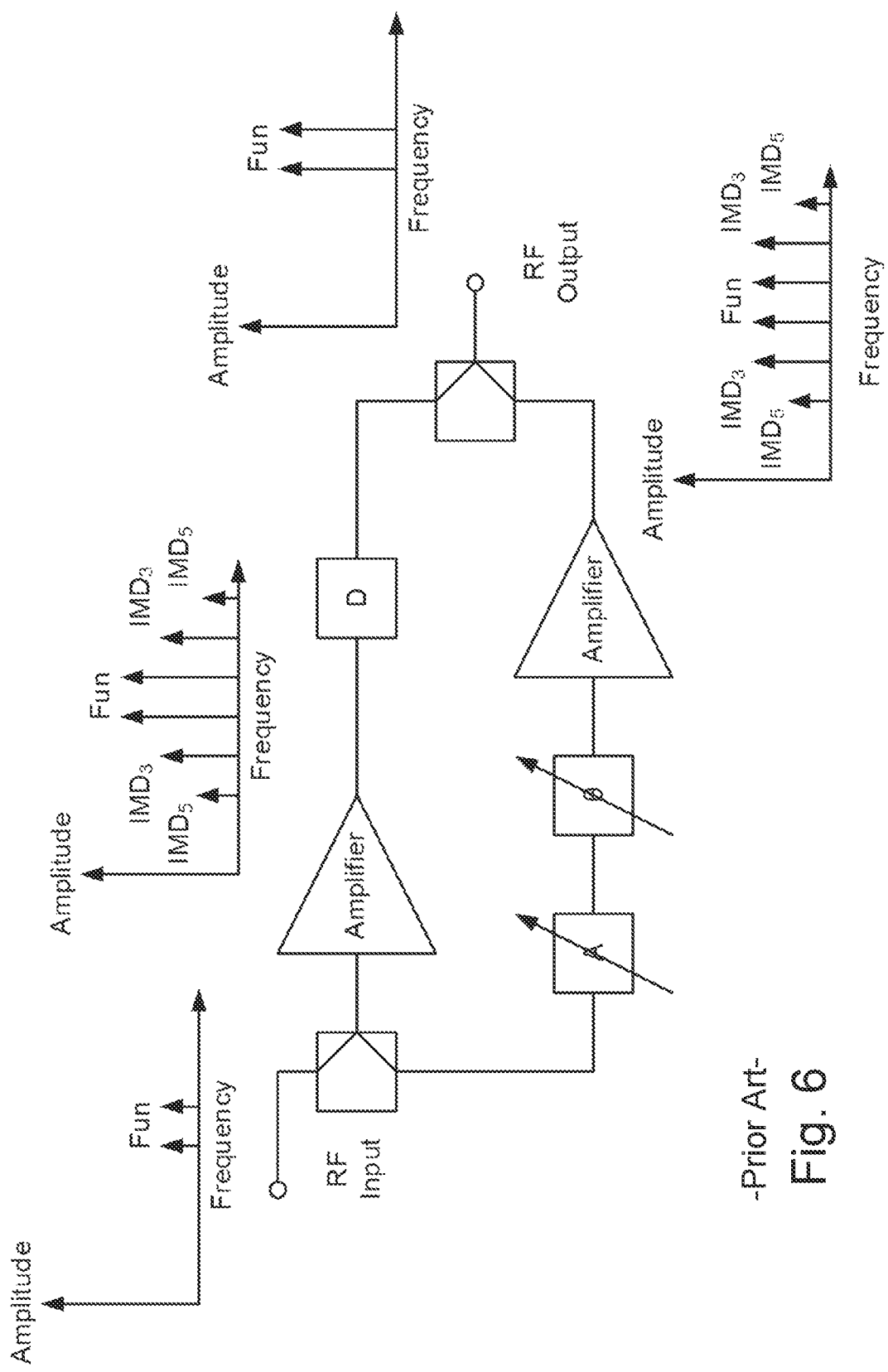
FIG. 6 shows a schematic illustration of linearized RF power amplifier (PA) that exploits backwards-travelling signals according to prior art.

FIG. 6 shows a schematic illustration of a linearized amplifier PA. The PA of FIG. 6 exploits backwards-travelling signals. The PA comprises a first Wilkinson power splitter (PS) that directs a RF input signal to a first amplifier (upper amplifier in FIG. 6). The output of the first amplifier is then coupled to a delay element D that provides a delayed version of the signal, and the delayed signal is then directed to a second PS. The first amplifier generates distortion products at its output alongside the wanted signal. The non-linear nature of the first amplifier also results in distortion products being generated at its input. This error signal is what is extracted by the first PS and directed to a second amplifier. Alongside the distortion products, the error signal will also contain a reflected version of the input signal due to mismatch at the input of the amplifier. The error signal is gain and phase manipulated by a variable attenuator A and a variable phase shifter θ respectively and amplified in a second amplifier. The spectrum of the output of the second amplifier is shown inset in the figure, for the case where the RF input comprises two fundamental tones (Fun). The spectrum shows that the distortion product ($IMD_3$ and $IMD_5$) as well as Fun; note that the Fun components arise from the reflected version of the input signal that is fed into the second amplifier. A 'Fun' component is generated in the input reflected signal. In this example, the 'Fun' component has the same amplitude as the $IMD_3$. If A and θ are configured to set the amplitude of the $IMD_3$ at the lower amplifier so that they cancel the $IMD_3$ components of the upper amplifier, there will only be a very small cancellation of the 'Fun' at the output.

The output of the second amplifier is directed to the second PS. At the second PS, the delayed output from the first amplifier and the output from the second amplifier are combined to provide an RF output signal. By tuning the gain and phase modulation in A and θ, the distortion product may be suppressed from the RF output signal.

The PA of FIG. 6 uses the distortion generated at the input port of the first amplifier to suppress the distortion at the PA output in a feedforward structure. The first amplifier (upper amplifier in the figure) amplifies the wanted RF input signal, while the second amplifier only amplifies an error signal.

Figure 7:
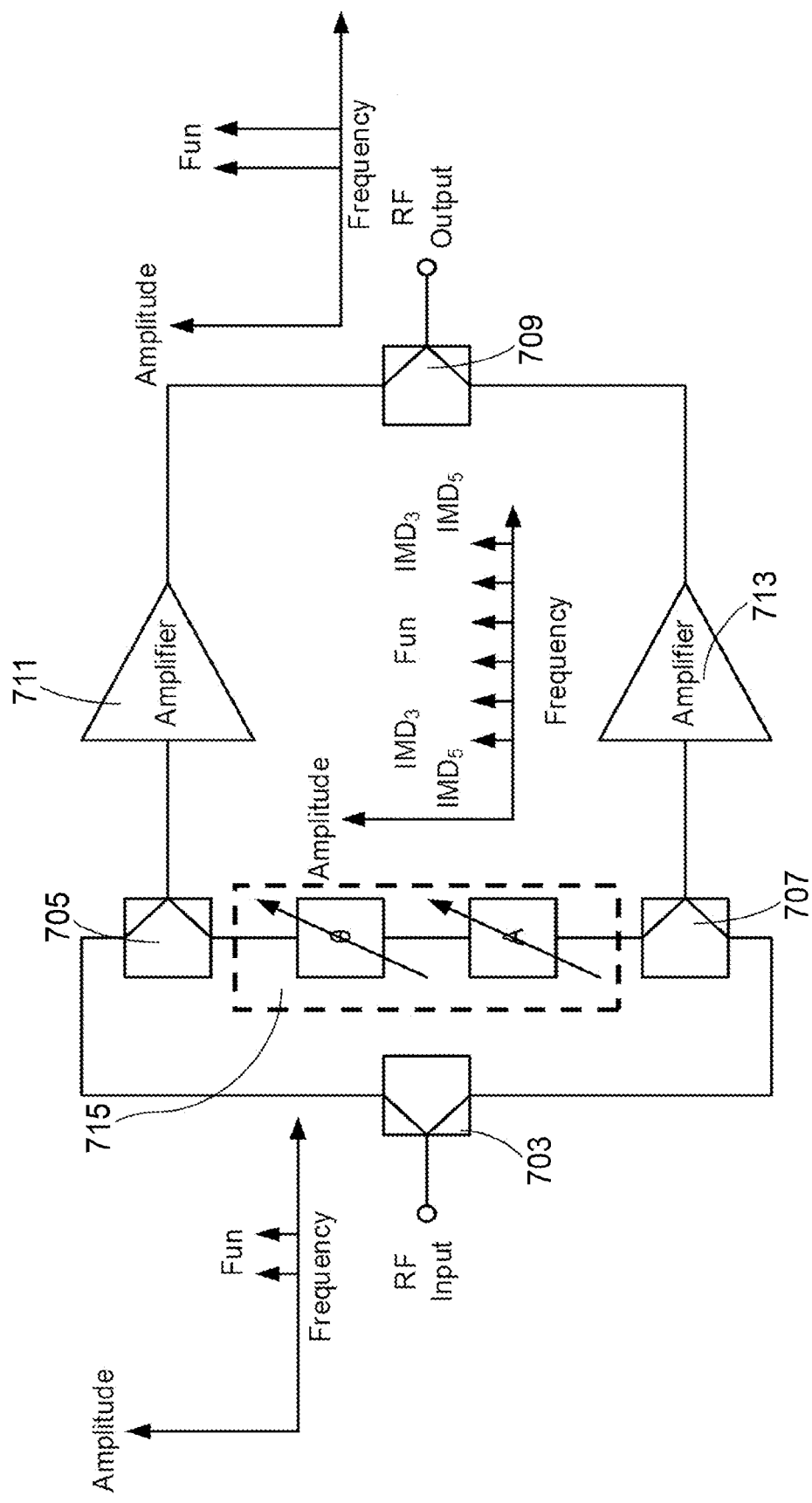
FIG. 7 shows a schematic illustration of RF power amplifier (PA) with two amplifiers arranged in parallel and operating in phase and that self generates analogue pre-distortion according to an embodiment.

FIG. 7 shows a schematic illustration of a linearized PA 700 according to an embodiment. The PA 700 of FIG. 7 is a parallel amplifier with self-generating analogue pre-distortion. The PA 700 comprises a first amplifier 711 and a second amplifier 713 arranged in a parallel configuration and with their outputs directed to an output PS 709 where the outputs are combined to provide an RF Output of the PA 700.

In the configuration shown in FIG. 7 an RF input signal is split equally using an input Wilkinson power splitter PS 703, and then directed to the first amplifier 711 via a first PS 705 and to the second amplifier 713 via a second PS 707.

Both amplifiers generate a distortion product at their input when a two-tone test signal is applied.

In general, all amplifiers generate distortion products ($IMD_3$, $IMD_5$) when a two-tone test signal is applied. The frequencies of the $IMD_3$ and $IMD_5$ components are the same for a given two-tone test signal. However, the amplitude and phase of the $IMD_3$ and $IMD_5$ depends on the particular type of amplifier. For example an amplifier A designed for application A will generally have a different distortion profile compared to an Amplifier B designed for application B. Two Amplifier As will have similar, but not necessarily identical distortion profiles. In the plots shown in FIG. 10 and FIG. 11, two amplifiers of the same type are used. However, it will be appreciated that two different amplifiers of different types may be used.

Additionally and optionally, both amplifiers have a similar distortion profile; that is, both amplifiers generate similar distortion products. By similar distortion products, it is meant that the amplitudes and/or phases of the distortion products ($IMD_3$, $IMD_5$) generated by each amplifier differ from each other by up to 5%. In particular, both amplifiers generate similar distortion products at their inputs.

Additionally and optionally, both amplifiers are similar. By the amplifiers being similar, it is meant that both amplifiers are of the same model or type with similar characteristics. Such amplifiers produce similar distortion products. By similar characteristics, it is meant that the amplifiers have a gain and/or third order intercept point that are close to each other. For example, the gains and/or third order intercept points of the two amplifiers differ from one another by up to 2%. The gain and/or third order intercept point impact the amplitude and phase of the $IMD_3$ component. When the gains and/or third intercept points of two amplifiers are close to each other, the amplifiers generate similar distortion products. By similar distortion products, it is meant that the amplitudes and/or phases of the distortion products ($IMD_3$, $IMD_5$) generated by each amplifier differ from each other by up to 5%.

Additionally and optionally, both amplifiers operate at the same operating point in their gain compression regions.

This distortion product from the amplifiers' input is split by its respective input splitter (first PS 705 or second PS 707). In this embodiment, all splitters are equal (3 dB) Wilkinson types. It will be appreciated that other splitters such as rat race couplers or hybrid couplers may alternatively be used. The distortion product that is split (which is half of the distortion product generated at the input of each amplifier) is then passed through an analogue pre-distortion (APD) network 715 (shown in a dashed box in the figure). In the embodiment of FIG. 7, the APD network 715 comprises a variable attenuator A and a phase shifter θ. The APD network 715 is configured to couple the input of the first amplifier 711, via the first PS 705, to the input of the second amplifier 713, via the second PS 707.

The RF input signal is split by the input splitter 703 and each half travels towards the first PS 705 and second PS 707. At the first PS 705, the portion of the RF input is directed to the input of the first amplifier 711 where it is amplified. The first amplifier 711 generates a distortion product at its input. The distortion product travels backwards (away from the first amplifier) towards the first splitter 705. Together with the distortion product, there is a portion of the RF input signal that is reflected from the first amplifier's 711 inputs due to mismatch. That reflected portion of the RF input signal also travels backwards towards the first splitter 705. At the first splitter 705, both the distortion product and the reflected portion of the RF input is directed to the APD network 715. The distortion product and the reflected portion of the RF input pass through the APD network 715 and enter the second PS 707. At the second PS 707, the distortion product and the reflected portion of the RF input are directed to the input of the second amplifier 713.

Similarly, the portion of the RF input from the input PS 703 that travels towards the second PS 707 results in a distortion product and a reflected portion of the RF input to be directed to the input of the first amplifier 711.

The distortion produced by the input of one amplifier is therefore presented to the input of the other amplifier via the APD network 715. This distortion product is used to pre-distort the input signal presented to that amplifier. The distortion product used to pre-distort an amplifier and presented at the input of said amplifier is referred to as a pre-distortion signal. A and θ are manipulated so that the pre-distortion signal fed through them cancel the distortion generated by the amplifier. For example, A and θ are adjusted so that the pre-distortion signal presented to the input of an amplifier has an appropriate amplitude and phase so that when amplified, its distortion cancels with that generated in that amplifier. For example, a suitable value of A and θ may be obtained by empirically adjusting A and θ and monitoring the RF Output until the distortion products are suppressed. A and θ correspond to variable attenuators and variable phase shifters similar to that of FIG. 4.

An example of the spectrum of the signal that is presented at the inputs of the amplifiers, for the case where the RF input comprises two fundamental tones, is shown inset in FIG. 7.

The amplified signals from the first amplifier and the second amplifier are then recombined in the output Wilkinson power splitter 709. If the amplified signals presented at the two inputs to the output PS 709 are equal, they will combine in phase and there will be no loss in the output splitter.

Each amplifier functions as a pre-distorter for the other amplifier. Each shares both the function of amplifier and pre-distorter so maximum functionality is maintained.

In FIG. 7, a reflection containing distortion product is generated at the input of the first amplifier. This reflection is channeled back to the second amplifier input through the first dual directional coupler and then amplitude and phase modulated to direct at the input of the second amplifier such that the IMD3 products generated at the second amplifier can be minimized. Similarly, the second reflection containing distortion product is generated at the input of the second amplifier. The second reflection is channeled back to the first amplifier input through the second dual directional coupler and then amplitude and phase modulated to be directed at the input of the first amplifier such that the IMD3 products generated at the first amplifier can be minimized. That is an improvement over prior art in which only one of the two amplifiers are used to correct the other. In FIG. 7 both amplifiers are used to correct each other.

The PA 700 of FIG. 7 comprises a parallel arrangement of two amplifiers. It will be understood that this arrangement could be extended to use any even number of amplifiers, by arranging pairs of amplifiers configured as in FIG. 7 in parallel.

The PA 700 of FIG. 7 uses analogue pre-distortion to pre-distort the signal that is inputted to the amplifiers to suppress the distortion products that are produced by each of the amplifiers. The pre-distortion signal is obtained in a manner similar to the PA of FIG. 6. However, unlike the PA of FIG. 6, the embodiment of FIG. 7, the pre-distortion signal is directed to the input of the amplifiers in order to suppress the distortion product of the amplifiers. Thus, each amplifier in FIG. 7 provides an amplified signal at its output wherein the distortion product is suppressed. Each amplifier amplifies the input signal 'Fun' and may overcome any losses at the input splitter 703 and output splitter 709.

The PA of FIG. 7 avoids the use of tuneable power splitters such as shown in FIG. 2. Such tuneable power splitters are challenging to produce as they are likely to incur extra loss which will reduce $P_{OUT}$ and efficiency, particularly at the Ku and Ka bands used for mobile broadcast transmission.

In the linearized PA of FIG. 7, both the first and second amplifier operate to amplify the RF input signal and contribute to the wanted signal at the output of the PA. Thus, the PA of FIG. 7 has a higher efficiency than the PA described in relation to FIG. 3, FIG. 4, and FIG. 6, where only one amplifier amplifies the wanted signal, while the other amplifier only amplifies the distortion products, which means it does not contribute to the wanted signal at the output of the amplifier.

The PA of FIG. 7 uses an APD network 715 that comprises two control elements: a variable attenuator A and a phase shifter θ. Thus, the APD network used in PA of FIG. 7 is simpler compared to the APD block described in FIG. 4, which comprises four control elements. Further, the use of more control elements may limit the operation bandwidth of the PA. Hence, by using only two control elements, the PA of FIG. 7 may have improved bandwidth. For example, when the PA of FIG. 7 is used for the Ku and Ka band, it may operate with 500 MHz of 2-4% fractional bandwidth. For similar reasons, the PA of FIG. 7 may exhibit improved gain when compared to the PA described in relation to FIG. 5 (which comprises control elements in both signal paths), since each control element may introduce some loss.

The PA of FIG. 7 uses an APD network 715 that comprises a variable attenuator A and a phase shifter θ. It will be appreciated that, in an alternative embodiment, the variable attenuators and phase shifters are not variable and, instead, have fixed values. Suitable values for the attenuator and the phase shifter are determined empirically. Alternatively, it will be appreciated that the APD network 715 any other circuitry that allows the amplitude and/or phase of a signal presented to the APD network 715 to be manipulated.

Figure 8:
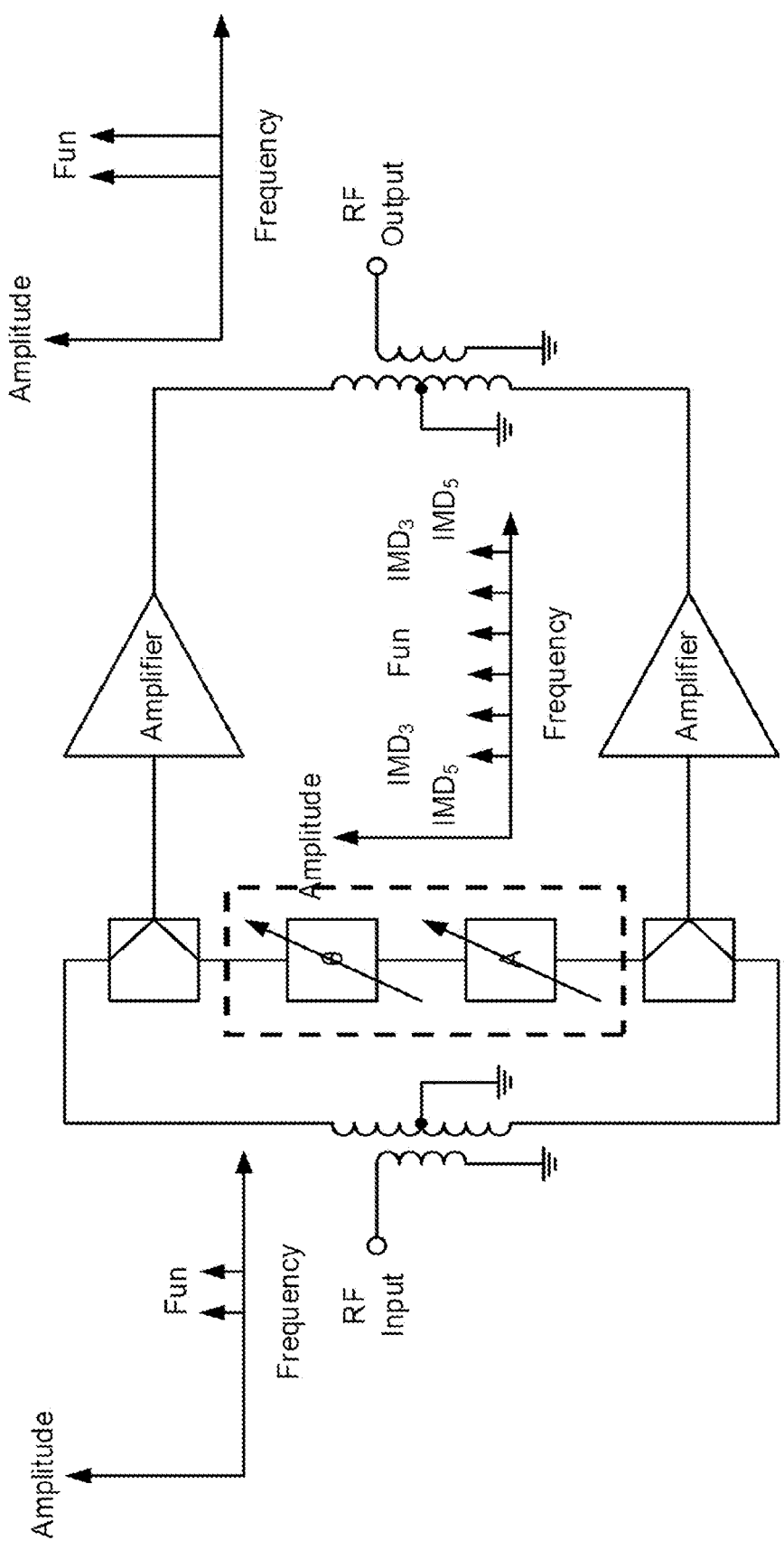
FIG. 8 shows a schematic illustration of RF power amplifier (PA) with two amplifiers arranged in parallel and operating in anti-phase and that self generates analogue pre-distortion according to another embodiment.

FIG. 8 shows a schematic illustration of a linearized PA according to an embodiment. The PA is an anti-phase parallel amplifier with self-generating analogue pre-distortion. The linearized PA is the similar to that of FIG. 7 except that the input PS and the output PS are replaced by transformers or baluns. The first amplifier and the second amplifier then operate in anti-phase. The first and second amplifier still function as a pre-distorter for each other. The determined values of A and θ will be different to that of FIG. 7.

When the first amplifier and the second amplifier operate in anti-phase, it is meant that the RF input signals presented to the inputs of the first and second amplifier have opposite polarities. In contrast, in the embodiment of FIG. 7, the first and second amplifiers operate in phase and the signals presented to their inputs have the same polarities.

The transformer or balun converts a balanced signal to an unbalanced signal and may comprise a first winding, where an input signal is received, and a second winding where a converted signal is outputted.

Figure 9:
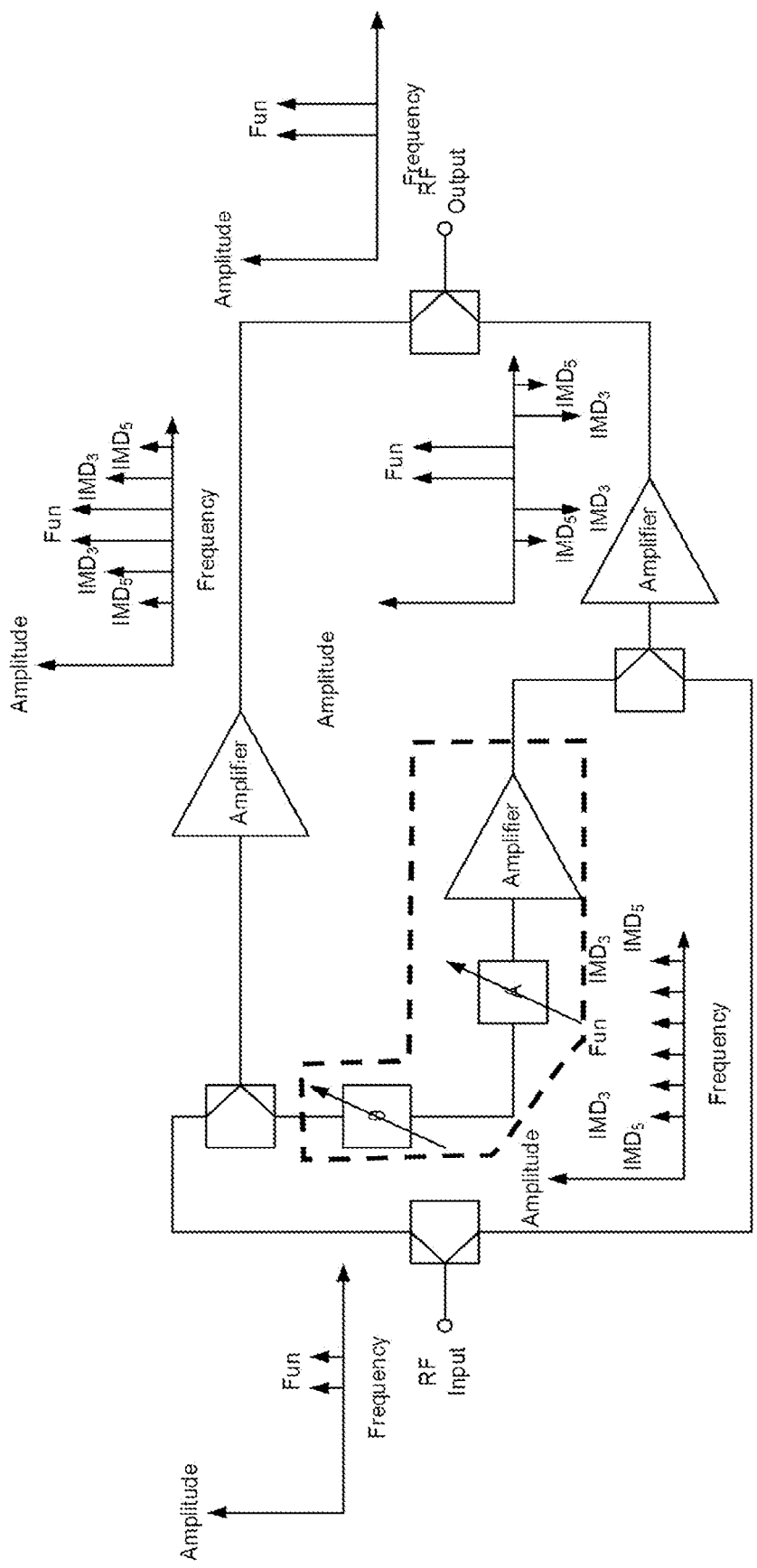
FIG. 9 shows a schematic illustration of RF power amplifier (PA) with two amplifiers arranged in parallel and that self generates analogue pre-distortion according to yet another embodiment.

FIG. 9 shows a schematic illustration of a linearized PA according to another embodiment. The PA is a parallel amplifier incorporating analogue pre-distortion. The PA is similar to that described in relation to FIG. 7 except that the APD network (shown in the dashed box in FIG. 9) comprises a third amplifier.

The third amplifier causes the distortion product generated at the input of the first amplifier (upper amplifier in FIG. 9) to pass one-way through A and θ, from the first amplifier to the second amplifier (lower amplifier in FIG. 9). The first amplifier only sees the RF input signal; it does not see a pre-distortion signal from the second amplifier. Only the second amplifier operates with a pre-distortion signal. The third amplifier amplifies the pre-distortion signal generated from the first amplifier and the amplified pre-distortion signal is directed into the input of the second amplifier. Note that this differs from the arrangement of FIG. 6 where the amplified pre-distortion signal is directed into the output splitter. Another difference from the arrangement of FIG. 6 is that the second (lower) amplifier of FIG. 9 amplifies the 'Fun' component as well and not just the distortion product.

In the PA of FIG. 9, the pre-distortion signal is generated at the input of the first (upper amplifier in the figure) amplifier. It is gain and phase manipulated and amplified further by the third amplifier. The third amplifier ensures that a signal only flows one way through this path. This pre-distortion signal is then added to the input signal and fed to the second (lower amplifier in the figure) amplifier. Since the first (upper) amplifier does not receive a pre-distorted signal itself, it will generate distortion at its output. The lower amplifier must therefore generate distortion products with an opposite polarity to the distortion product of the upper amplifier in order to cancel the distortion of the upper amplifier, while the wanted signal from both upper and lower amplifier add in-phase at the output. Note that the arrangement of FIG. 9 differs from that of FIG. 5 in that the pre-distortion signal is generated in a different fashion.

Figure 10:
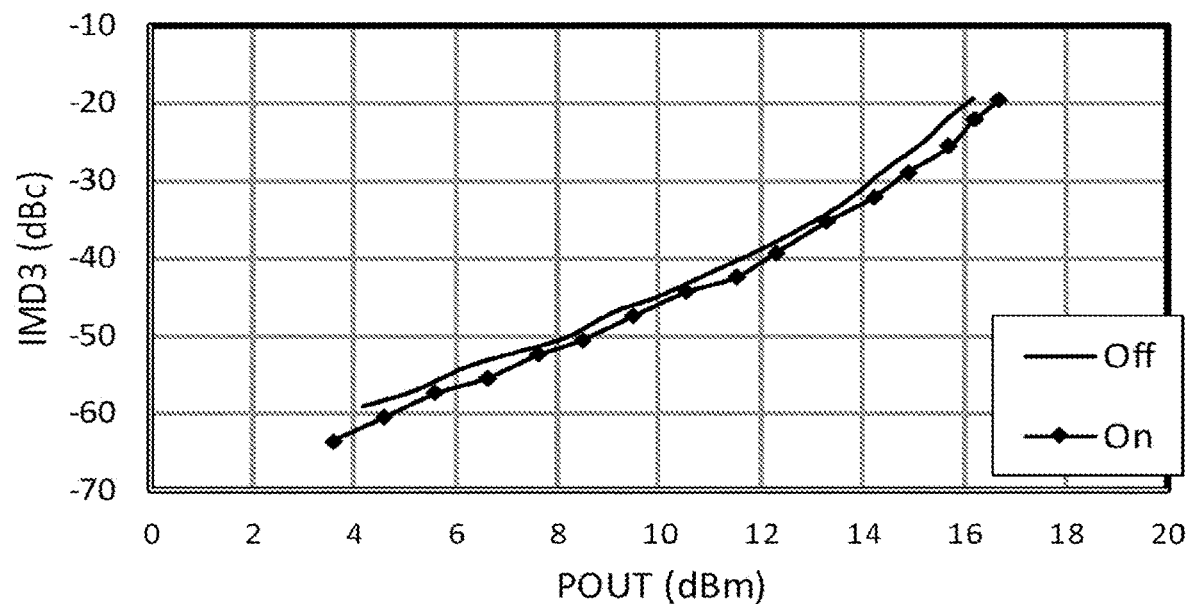
FIG. 10 shows a schematic illustration of plot of the distortion product obtained at the output of the PA of FIG. 7 when the tone spacing of the input signal is 1 MHz.

FIG. 10 shows a plot of the distortion product obtained at the output of the PA of FIG. 7, as a function of $P_{OUT}$ (dBm), when a two-tone RF input, with tone spacing of 1 MHz is applied at the input. FIG. 10 show one trace (−) labelled off and a second trace (+) labelled on. "Off" means that the APD network is turned off and does not provide a pre-distortion signal. "On" means that the APD network is turned on and provides a pre-distortion signal for suppressing the distortion product. The APD may be turned off by physically removing A and θ, and connecting 50 ohm loads to those nodes.

Alternatively, this could be done by increasing the value of A so that it did not pass any signal, or only a very small one. The distortion product in this measurement is the $IMD_3$ and is measured by considering the ratio between the $IMD_3$ term and the fundamental tones (shown in dBc). The PA of FIG. 7 was configured to operate at 2 GHz and used two identical class A amplifiers (Mini-Circuits ZX60-43-S+). The arrangement exhibited an approximately 3 dBc improvement in $IMD_3$. In the example of FIG. 10, A and θ were empirically adjusted such that the distortion product is suppressed.

Figure 11:
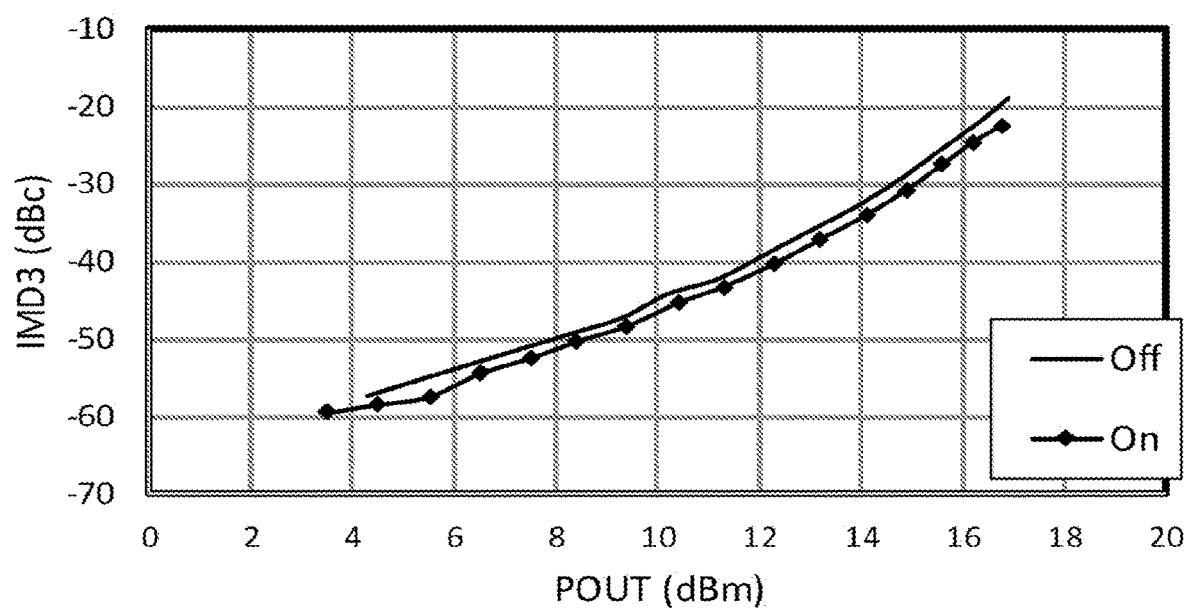
FIG. 11 shows a schematic illustration of plot of the distortion product obtained at the output of the PA of FIG. 7 when the tone spacing of the input signal is 24 MHz.

FIG. 11 shows plot similar to that of FIG. 10 except that the tone spacing is 24 MHz. A similar improvement is noted, which suggests good wideband operation.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A power amplifier comprising:
a first amplifier;
a second amplifier, wherein the first and second amplifiers are arranged in parallel;
an analogue pre-distortion network;
a first coupler; and
a second coupler,
wherein the first coupler is configured to receive an input signal, direct said input signal to the first amplifier, and direct a first pre-distortion signal to the analogue pre-distortion network, wherein
the first pre-distortion signal includes a first distortion component at the input of the first amplifier, the first distortion component being generated by the first amplifier, the first pre-distortion signal travelling from the first amplifier towards the first coupler, and
the analogue pre-distortion network is configured to receive the first pre-distortion signal and adjust at least one of its amplitude or phase to obtain an adjusted first pre-distortion signal,
the second coupler is configured to direct the adjusted first pre-distortion signal to the second amplifier, and
the second coupler is further configured to direct a second pre-distortion signal to the analogue pre-distortion network, wherein
the second pre-distortion signal includes a second distortion component at the input of the second amplifier, the second distortion component being generated by the second amplifier.

2. The power amplifier according to claim 1, wherein the first pre-distortion signal further includes a portion of the input signal.

3. The power amplifier according to claim 1, wherein the analogue pre-distortion network includes at least one of an attenuator or a phase shifter.

4. The power amplifier according to claim 3; wherein at least one of the attenuator or the phase shifter is variable.

5. The power amplifier according to claim 3, wherein at least one of the attenuator or the phase shifter is configured so that the adjusted first pre-distortion signal received at the second amplifier causes a distortion at an output of the second amplifier to be suppressed.

6. The power amplifier according to claim 1,
wherein the analogue pre-distortion network is further configured to receive the second pre-distortion signal and adjust at least one of its amplitude or phase to obtain an adjusted second pre-distortion signal; and
the first coupler is further configured to direct the adjusted second pre-distortion signal to the first amplifier.

7. The power amplifier according to claim 1, wherein at least one of the first coupler or the second coupler is a Wilkinson power splitter.

8. The power amplifier according to claim 7, wherein outputs of the first and second amplifiers are combined in the Wilkinson power splitter to provide an output signal.

9. The power amplifier according to claim 8, wherein the first amplifier and the second amplifier are operable in phase.

10. The power amplifier according to claim 7, wherein outputs of the first and second amplifiers are combined in a transformer or balun to provide an output signal.

11. The power amplifier according to claim 10, wherein the first amplifier and the second amplifier are operable in anti-phase.

12. The power amplifier according to claim 1, wherein the first amplifier and the second amplifier are operable in their gain compression region.

13. The power amplifier according to claim 6, wherein the first amplifier and the second amplifier are similar such that the first distortion component and the second distortion component are similar to each other.

14. The power amplifier according to claim 4, wherein the analogue pre-distortion network further includes a third amplifier that amplifies the first pre-distortion signal.

15. A relay system for Ku and Ka bands comprising:
a first amplifier;
a second amplifier, wherein the first and second amplifiers are arranged in parallel;
an analogue pre-distortion network;
a first coupler; and
a second coupler,
wherein the first coupler is configured to receive an input signal, direct the input signal to the first amplifier, and direct a first pre-distortion signal to the analogue pre-distortion network, wherein
the first pre-distortion signal includes a first distortion component at the input of the first amplifier, the first distortion component being generated by the first amplifier, the first pre-distortion signal traveling from the first amplifier towards the first coupler, and
the analogue pre-distortion network is configured to receive the first pre-distortion signal and adjust at least one of its amplitude or phase to obtain an adjusted first pre-distortion signal, and
the second coupler is configured to direct the adjusted first pre-distortion signal to the second amplifier,
wherein the first amplifier and the second amplifier are operable in anti-phase.

16. A method comprising:
receiving an input signal;
directing the input signal to a first amplifier and a second amplifier, the first amplifier and the second amplifier being included in a power amplifier;
directing a first pre-distortion signal from the first amplifier to an analogue pre-distortion network to adjust at least one of an amplitude or phase of the first pre-distortion signal to obtain an adjusted first pre-distortion signal, the analogue pre-distortion network being included in the power amplifier;
directing the adjusted first pre-distortion signal to the second amplifier; and
directing a second pre-distortion signal from the second amplifier to the analogue pre-distortion network,
wherein the first pre-distortion signal includes a first distortion component at the input of the first amplifier, the first distortion component being generated by the first amplifier, and
the second pre-distortion signal includes a second distortion component at the input of the second amplifier, the second distortion component being generated by the second amplifier.

17. The power amplifier according to claim 1, wherein the first amplifier and the second amplifier are operable in anti-phase.

18. The method according to claim 16, wherein the first amplifier and the second amplifier are operable in anti-phase.

19. A power amplifier comprising:
a first amplifier;
a second amplifier, wherein the first and second amplifiers are arranged in parallel;
an analogue pre-distortion network;
a first coupler; and
a second coupler,
wherein the first coupler is configured to receive an input signal, direct said input signal to the first amplifier, and direct a first pre-distortion signal to the analogue pre-distortion network, wherein
the first pre-distortion signal includes a first distortion component at the input of the first amplifier, the first distortion component being generated by the first amplifier, the first pre-distortion signal travelling from the first amplifier towards the first coupler, and
the analogue pre-distortion network is configured to receive the first pre-distortion signal and adjust at least one of its amplitude or phase to obtain an adjusted first pre-distortion signal,
the second coupler is configured to direct the adjusted first pre-distortion signal to the second amplifier,
the second coupler is further configured to direct a second pre-distortion signal to the analogue pre-distortion network,
the second pre-distortion signal includes a second distortion component at the input of the second amplifier, the second distortion component being generated by the second amplifier,
the analogue pre-distortion network is further configured to receive the second pre-distortion signal and adjust at least one of its amplitude or phase to obtain an adjusted second pre-distortion signal; and
the first coupler is further configured to direct the adjusted second pre-distortion signal to the first amplifier.

20. A power amplifier comprising:
a first amplifier;
a second amplifier, wherein the first and second amplifiers are arranged in parallel;
an analogue pre-distortion network;
a first coupler; and
a second coupler,
wherein the first coupler is configured to receive an input signal, direct said input signal to the first amplifier, and direct a first pre-distortion signal to the analogue pre-distortion network, wherein
the first pre-distortion signal includes a first distortion component at the input of the first amplifier, the first distortion component being generated by the first amplifier, the first pre-distortion signal travelling from the first amplifier towards the first coupler, and
the analogue pre-distortion network is configured to receive the first pre-distortion signal and adjust at least one of its amplitude or phase to obtain an adjusted first pre-distortion signal,
the second coupler is configured to direct the adjusted first pre-distortion signal to the second amplifier,
at least one of the first coupler or the second coupler is a Wilkinson power splitter,
outputs of the first and second amplifiers are combined in a transformer or balun to provide an output signal, and
the first amplifier and the second amplifier are operable in anti-phase.

* * * * *